United States Patent
Yamazawa (10) Patent No.: US 9,941,809 B2
(45) Date of Patent: Apr. 10, 2018

(54) INVERTER DEVICE

(71) Applicant: FUJI ELECTRIC CO., LTD., Kawasaki-shi, Kanagawa (JP)

(72) Inventor: Kotaro Yamazawa, Suzuka (JP)

(73) Assignee: FUJI ELECTRIC CO., LTD., Kawasaki-Shi, Kanagawa (JP)

( * ) Notice: Subject to any disclaimer, the term of this patent is extended or adjusted under 35 U.S.C. 154(b) by 0 days.

(21) Appl. No.: 15/245,454

(22) Filed: Aug. 24, 2016

(65) Prior Publication Data

US 2017/0155336 A1 Jun. 1, 2017

(30) Foreign Application Priority Data

Nov. 26, 2015 (JP) ................. 2015-230170

(51) Int. Cl.
*H05K 5/00* (2006.01)
*H02M 7/00* (2006.01)
*H05K 7/14* (2006.01)

(52) U.S. Cl.
CPC .......... *H02M 7/003* (2013.01); *H05K 7/1432* (2013.01)

(58) Field of Classification Search
CPC ............... H05K 5/0008; H05K 5/0017; H05K 7/20127; H05K 7/209; H02M 7/003
USPC ................. 361/690, 728–730, 752, 796, 800
See application file for complete search history.

(56) References Cited

U.S. PATENT DOCUMENTS

| | | | | |
|---|---|---|---|---|
| 5,091,823 A * | 2/1992 | Kanbara | ................. | H02M 5/44 174/351 |
| 5,598,322 A * | 1/1997 | Von Arx | ................ | H02B 1/052 361/704 |
| 6,320,776 B1 * | 11/2001 | Kajiura | ................. | H02M 7/003 361/709 |
| D457,492 S * | 5/2002 | Kim | ............................ | D13/110 |
| D540,252 S * | 4/2007 | Hsien | .......................... | D13/110 |
| 7,643,304 B2 * | 1/2010 | Hirota | ................... | H02M 7/003 361/601 |

FOREIGN PATENT DOCUMENTS

JP H06-303778 A 10/1994

* cited by examiner

*Primary Examiner* — Hung S Bui
(74) *Attorney, Agent, or Firm* — Manabu Kanesaka (57) ABSTRACT

An inverter device includes an inverter device body portion and a protective cover that covers the inverter device body portion, and the protective cover integrally includes a front surface portion that covers the front surface of the inverter device body portion, a top surface portion that covers the top surface of the inverter device body portion, a first side surface portion that covers a first side surface of the inverter device body portion, and a second side surface portion that covers a second side surface of the inverter device body portion.

14 Claims, 5 Drawing Sheets

INVERTER DEVICE

CROSS-REFERENCE TO RELATED APPLICATION

The priority application number JP2015-230170, Inverter Device, Nov. 26, 2015, Kotaro Yamazawa, upon which this patent application is based, is hereby incorporated by reference.

BACKGROUND OF THE INVENTION

Field of the Invention

The present invention relates to an inverter device, and more particularly, it relates to an inverter device including a protective cover that covers an inverter device body portion.

Description of the Background Art

An inverter device including a protective cover that covers an inverter device body portion as an option in order to conform to safety standards having a raised protection rating relative to a standard inverter device is known in general, as disclosed in Japanese Patent Laying-Open No. 6-303778 (1994).

Japanese Patent Laying-Open No. 6-303778 discloses an inverter device including an inverter device body portion. Both side surfaces of this inverter device body portion are provided with multiple ventilating windows (slits) for venting air inside the inverter device body portion. This inverter device is provided with blind plates for occluding the ventilating windows. The blind plates are provided with multiple claws. The multiple claws are fitted into holes of the ventilating windows so that the blind plates are mounted on the ventilating windows. The blind plates are individually mounted on the multiple ventilating windows, respectively.

However, in the inverter device described in Japanese Patent Laying-Open No. 6-303778, the blind plates for occluding the ventilating windows are individually mounted on the multiple ventilating windows, respectively, and hence mounting workability for the blind plates (protective covers) is poor while the number of components of the blind plates (protective covers) is increased.

Furthermore, even when the size and outer shape of the inverter device body portion are fixed, the size of the ventilating windows and the shape, the number, the size, etc. of slits that the ventilating windows include may be varied according to the capacity of the inverter device. In this case, it is necessary to prepare the multiple types of blind plates according to the size of the ventilating windows and the shape etc. of the slits that the ventilating windows include, and hence the number of components is further increased.

SUMMARY OF THE INVENTION

The present invention has been proposed in order to solve the aforementioned problems, and an object of the present invention is to provide an inverter device capable of improving mounting workability for a protective cover while significantly reducing or preventing an increase in the number of components of a protective cover.

In order to attain the aforementioned object, an inverter device according to an aspect of the present invention includes an inverter device body portion and a protective cover that covers the inverter device body portion, and the protective cover integrally includes a front surface portion that covers the front surface of the inverter device body portion, a top surface portion that covers the top surface of the inverter device body portion, a first side surface portion that covers a first side surface of the inverter device body portion, and a second side surface portion that covers a second side surface of the inverter device body portion.

In the inverter device according to this aspect of the present invention, as hereinabove described, the protective cover integrally includes the front surface portion that covers the front surface of the inverter device body portion, the top surface portion that covers the top surface of the inverter device body portion, the first side surface portion that covers the first side surface of the inverter device body portion, and the second side surface portion that covers the second side surface of the inverter device body portion. Thus, the front surface, the top surface, the first side surface, and the second side surface of the inverter device body portion can be covered with the single protective cover, and hence an increase in the number of components of the protective cover can be significantly reduced or prevented. Furthermore, the front surface, the top surface, the first side surface, and the second side surface of the inverter device body portion can be covered simply by mounting the single protective cover on the inverter device body portion, and hence mounting workability for the protective cover can be improved as compared with the case where protective covers are individually mounted on the front surface, the top surface, the first side surface, and the second side surface of the inverter device body portion, respectively.

In the aforementioned inverter device according to this aspect, the protective cover preferably includes a first engaging portion that engages with the inverter device body portion, and the inverter device body portion preferably includes a second engaging portion that engages with the first engaging portion. According to this structure, the protective cover can be easily mounted on the inverter device body portion by engaging the first engaging portion of the protective cover with the second engaging portion of the inverter device body portion.

In this case, the second engaging portion of the inverter device body portion preferably protrudes forward from the front surface of the inverter device body portion. According to this structure, the protective cover can be mounted on the inverter device body portion by engaging the second engaging portion with the first engaging portion regardless of the shapes and sizes of slits, unlike the case where engaging portions engage with the multiple slits to mount the protective cover. More specifically, even when the slits for heat release are optimized (changed in shape) according to the performance of the inverter device body portion, the protective cover can be mounted on the inverter device body portion without changing the shape and size of the protective cover. Furthermore, the front surface, the top surface, the first side surface, and the second side surface of the inverter device body portion can be covered simply by engaging the second engaging portion that protrudes forward from the front surface of the inverter device body portion with the first engaging portion of the protective cover. Consequently, mounting workability for the protective cover can be improved unlike the case where protective covers are individually mounted on the multiple slits.

In the aforementioned inverter device in which the second engaging portion protrudes forward, the first engaging portion is preferably provided on the rear surface of the protective cover, and preferably engages with the second engaging portion protruding forward from the front surface of the inverter device body portion. According to this structure, the first engaging portion and the second engaging portion can easily engage with each other simply by mounting the protective cover from the side of the front surface of the inverter device body portion.

In the aforementioned inverter device according to this aspect, the front surface portion of the protective cover preferably covers a control terminal provided on the front surface of the inverter device body portion, and at least the top surface portion of the top surface portion, the first side surface portion, and the second side surface portion of the protective cover preferably covers a slit for heat release provided in the inverter device body portion. According to this structure, entry of extraneous material from above into the inverter device body portion through the slit for heat release can be significantly reduced or prevented by at least the top surface portion while the control terminal can be protected from external impact by the front surface portion of the single protective cover.

In addition, the top surface portion, the first side surface portion, and the second side surface portion are formed to be continuous with a front cover member that covers the front surface (control terminal) of a conventional inverter device body portion, whereby the protective cover integrally including the front surface portion, the top surface portion, the first side surface portion, and the second side surface portion according to the present invention can be easily formed.

In this case, the top surface portion preferably covers the slit from above in a state where the top surface portion is spaced by a predetermined distance from the slit. According to this structure, even when impact is applied from the outside of the top surface portion of the protective cover, the impact is partially absorbed by the clearance between the top surface portion and the slit (inverter device body portion), and hence the inverter device body portion can be protected from the external impact.

In the aforementioned inverter device according to this aspect, the front surface portion of the protective cover is preferably provided with a fastening hole for fixing the front surface portion to the inverter device body portion by a fastening member. According to this structure, the protective cover integrally includes the front surface portion that covers the front surface of the inverter device body portion, the top surface portion that covers the top surface of the inverter device body portion, the first side surface portion that covers the first side surface of the inverter device body portion, and the second side surface portion that covers the second side surface of the inverter device body portion so that the size (weight) of the protective cover is relatively increased, and hence when engagement of the engaging portions with each other results in insufficient fixation, the protective cover can be strongly fixed to the inverter device body portion by the fastening member through the fastening hole. Thus, disengagement of the protective cover having a relatively heavy weight from the inverter device body portion resulting from vibration or the like can be effectively and significantly reduced or prevented.

In the aforementioned inverter device according to this aspect, at least one of the first side surface portion and the second side surface portion of the protective cover is preferably provided with a side surface portion opening. According to this structure, a seal on which a product serial number and ratings, for example, are described, applied on at least one of the first side surface and the second side surface of the inverter device body portion can be easily checked through the side surface portion opening in a state where the protective cover is mounted on the inverter device body portion.

In the aforementioned inverter device according to this aspect, the front surface portion of the protective cover is preferably provided with an opening for an operation portion that exposes the operation portion of the inverter device body portion. According to this structure, the operation portion can be operated in the state where the protective cover is mounted on the inverter device body portion.

In this case, the opening for the operation portion is preferably provided to straddle the front surface portion, the top surface portion, the first side surface portion, and the second side surface portion. According to this structure, each of the front surface, the top surface, the first side surface, and the second side surface of the inverter device body portion is at least partially exposed from the opening of the operation portion, and hence heat can be effectively released from the opening for the operation portion.

In the aforementioned inverter device according to this aspect, a clearance is preferably provided between the inverter device body portion and at least one of the first side surface portion and the second side surface portion of the protective cover. According to this structure, even when impact is applied from the outside of at least one of the first side surface portion and the second side surface portion of the protective cover, the impact is partially absorbed by the clearance (more specifically, the clearance allows the protective cover to warp so that the impact is partially absorbed), and hence the inverter device body portion can be more effectively protected from the external impact as compared with the case where there is no clearance.

In this case, at least one of the first side surface portion and the second side surface portion of the protective cover preferably has a tapered shape in which the thickness thereof is gradually reduced such that the clearance is provided between the inverter device body portion and at least one of the first side surface portion and the second side surface portion of the protective cover. According to this structure, the clearance can be easily formed between the inverter device body portion and at least one of the first side surface portion and the second side surface portion of the protective cover.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

An embodiment of the present invention is hereinafter described with reference to the drawings.

The structure of an inverter device 100 according to this embodiment is now described with reference to FIGS. 1 to 8.

(Structure of Inverter Device)

Figure 1:
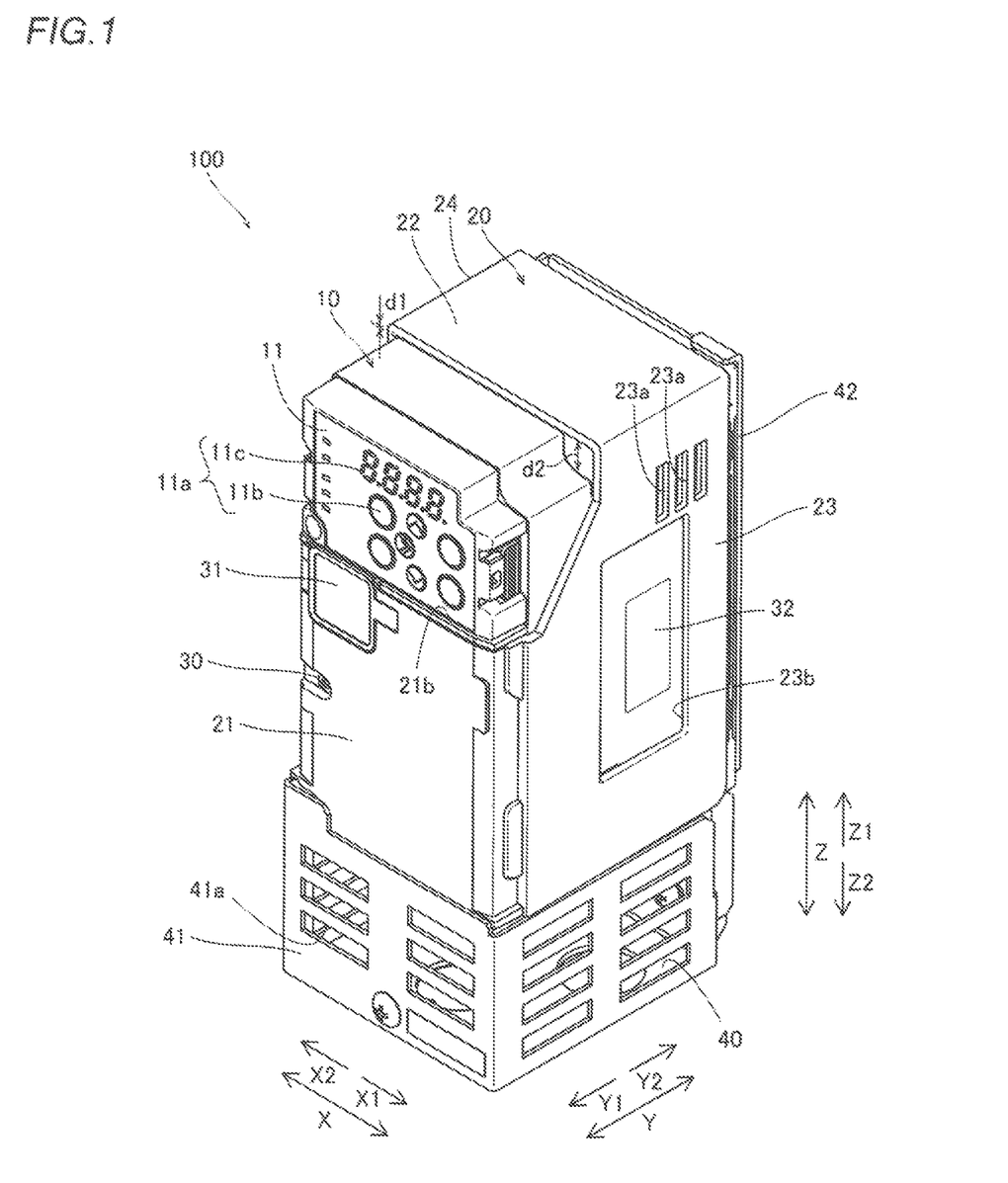
FIG. 1 is a perspective view of an inverter device according to an embodiment of the present invention.
Figure 2:
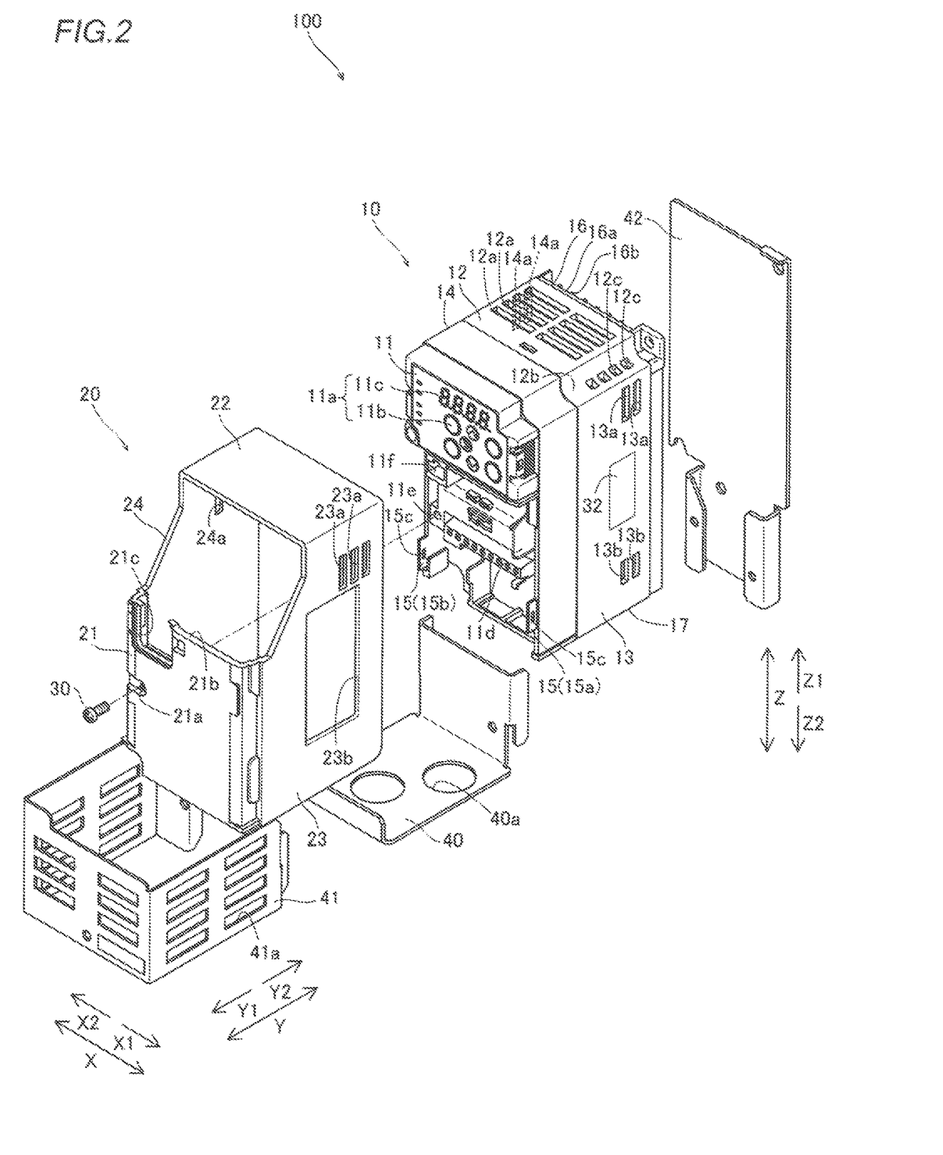
FIG. 2 is an exploded perspective view of the inverter device according to the embodiment of the present invention.

As shown in FIGS. 1 and 2, the inverter device 100 includes an inverter device body portion 10. The front surface 11 (a surface in a direction Y1) of the inverter device body portion 10 is provided with an operation portion 11a for operating the inverter device 100. The operation portion 11a includes operation buttons 11b and a display portion 11c. As shown in FIG. 2, the operation portion 11a is provided on an upper portion (in a direction Z1) of the front surface 11 of the inverter device body portion 10. The front surface 11 of the inverter device body portion 10 is provided with a control terminal 11d for controlling the inverter device 100 from an external portion. The front surface 11 of the inverter device body portion 10 is provided with a screw hole 11e into which a screw 30 described later is screwed. The front surface 11 of the inverter device body portion 10 is provided with a connector connecting portion 11f to which a connector (not shown) is connected. The screw hole 11e is an example of the "fastening hole" in the claims. The screw 30 is an example of the "fastening member" in the claims.

A top surface 12 of the inverter device body portion 10 is provided with multiple slits 12a for releasing (venting) the heat of air that exists inside the inverter device body portion 10. The slits 12a extend along a direction X. A portion (a portion of the top surface 12 in a direction X1) of the top surface 12 of the inverter device body portion 10, connected to a first side surface 13 (a side surface in the direction X1), is provided with a step portion 12b. The step portion 12b is also provided with multiple slits 12c. The slits 12a and the slits 12c have different shapes (areas) from each other. Specifically, the slits 12a and the slits 12c have substantially rectangular shapes in a plan view, and the length of each of the long sides of the slits 12a is larger than the length of each of the long sides of the silts 12c.

The first side surface 13 (the side surface in the direction X1) of the inverter device body portion 10 is provided with multiple slits 13a and multiple slits 13b for releasing the heat of air that exits inside the inverter device body portion 10. The slits 13a and the slits 13b are provided in the vicinity of an end of the first side surface 13 in the direction Z1 and in the vicinity of an end of the first side surface 13 in a direction Z2, respectively.

Similarly to the first side surface 13, multiple slits 14a (in the direction Z1) for releasing the heat of air that exists inside the inverter device body portion 10 are also in the vicinity of an end in the direction Z1 of a second side surface 14 (a side surface in a direction X2) of the inverter device body portion 10. In addition, multiple slits (not shown) are also in the vicinity of an end in the direction Z2 of the second side surface 14 of the inverter device body portion 10. The slits 13a, the slits 13b, and the slits 14a extend along a direction Z.

The slits 13a, the slits 13b, the slits 14a, and the unshown slits provided in the second side surface 14 have substantially the same shape as each other. On the other hand, the slits (the slits 12a and the slits 12c) of a top surface portion 22 and the slits (the slits 13a, the slits 13b, the slits 14a, and the unshown slits of the second side surface 14) provided in the first side surface 13 and the second side surface 14 have different shapes (areas) from each other. Specifically, the slits 13a, the slits 13b, and the slits 14a have substantially rectangular shapes in a plan view. The length of each of the long sides of the slits 13a, the slits 13b, the slits 14a, and the unshown slits of the second side surface 14 is smaller than the length of each of the long sides of the slits 12a of the top surface portion 22, and is larger than the length of each of the long sides of the slits 12c of the top surface portion 22.

Figure 3:
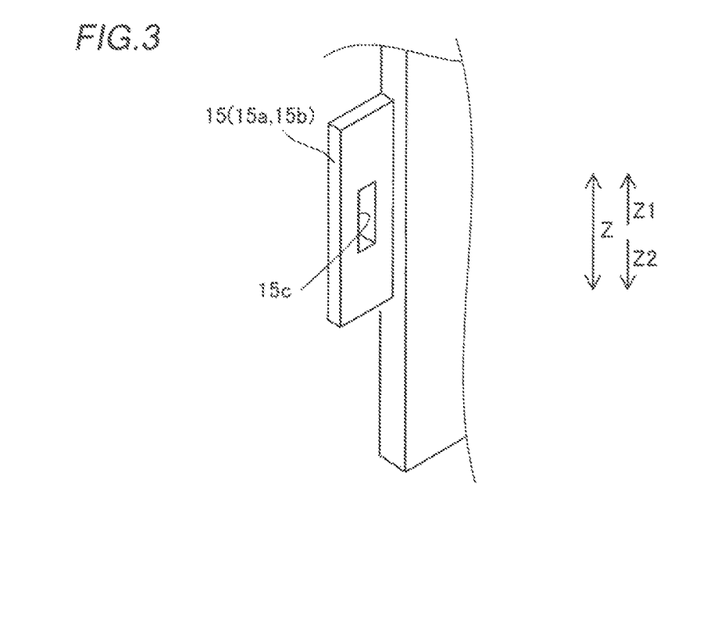
FIG. 3 is a partial enlarged view of FIG. 2.

According to this embodiment, the first side surface 13 and the second side surface 14 of the inverter device body portion 10 are provided with engaging portions 15 (engaging portions 15a and 15b) that engage with engaging portions 25 of a protective cover 20 described later, respectively. The engaging portions 15 protrudes in a direction (direction Y1) opposite to a direction (direction Y2) in which the protective cover 20 is mounted on the inverter device body portion 10 from the first side surface 13 and the second side surface 14. More specifically, the engaging portions 15 of the inverter device body portion 10 protrude forward (in the direction Y1) from the front surface 11 of the inverter device body portion 10. As shown in FIG. 3, the engaging portions 15 have substantially rectangular shapes and plate-shapes. Central portions of the engaging portions 15 are provided with recessed portions 15c with which protruding portions 25d of the engaging portions 25 (see FIG. 6) of the protective cover 20 engage. The recessed portions 15c have substantially rectangular shapes in a plan view, and extend in the direction Z. The recessed portions 15c have substantially triangular sections (see FIG. 8) to engage with the protruding portions 25d (substantially triangular shapes) of the engaging portions 25 of the protective cover 20. The engaging portions 15 are provided in lower portions (in the direction Z2) of the first side surface 13 and the second side surface 14. The engaging portions 15 (engaging portions 15a and 15b) are examples of the "first engaging portion" in the claims. The engaging portions 25 (engaging portions 25a and 25b) are examples of the "second engaging portion" in the claims.

As shown in FIG. 2, the back surface 16 (in the direction Y2) of the inverter device body portion 10 is provided with a heat radiation member 16a. The heat radiation member 16a is made of metal such as aluminum (Al), which is excellent in heat radiation property. The heat radiation member 16a is provided with multiple fins 16b. The heat radiation member 16a is configured to radiate heat from a switching element such as an IGBT (insulated gate bipolar transistor) provided in the inverter device body portion 10.

The inverter device 100 includes the protective cover 20 that covers the inverter device body portion 10. The protective cover 20 is made of resin, for example. According to this embodiment, the protective cover 20 integrally includes a front surface portion 21 that covers the front surface 11 of the inverter device body portion 10, the top surface portion 22 that covers the top surface 12, a first side surface portion 23 that covers the first side surface 13, and a second side surface portion 24 that covers the second side surface 14. More specifically, the top surface portion 22, the first side surface portion 23, and the second side surface portion 24 are formed to be continuous with a front cover member that covers the front surface (control terminal) of a conventional inverter device body portion.

Figure 4:
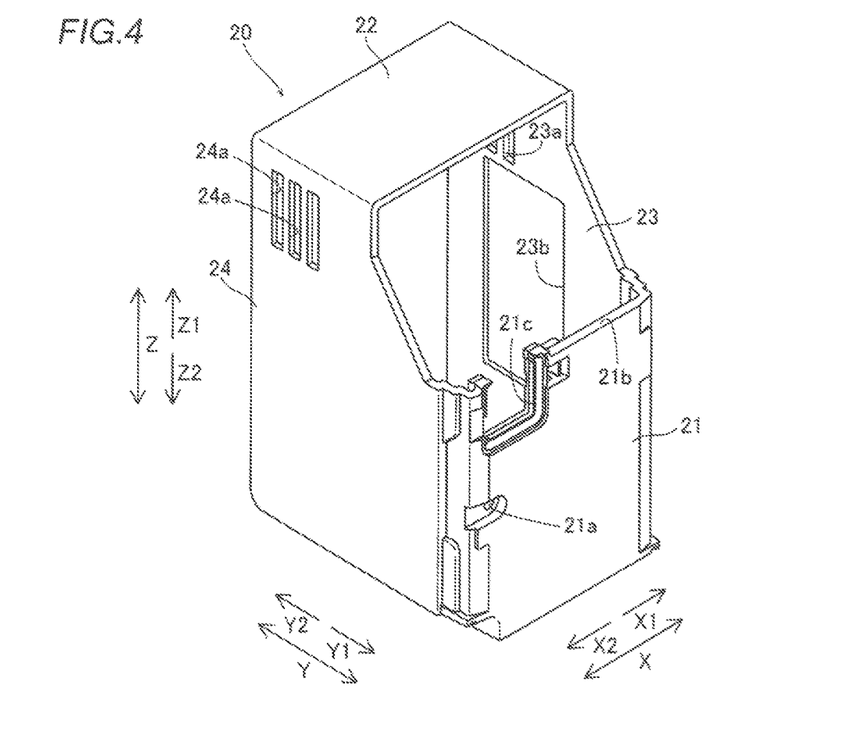
FIG. 4 is a perspective view of a protective cover of the inverter device according to the embodiment of the present invention.
Figure 5:
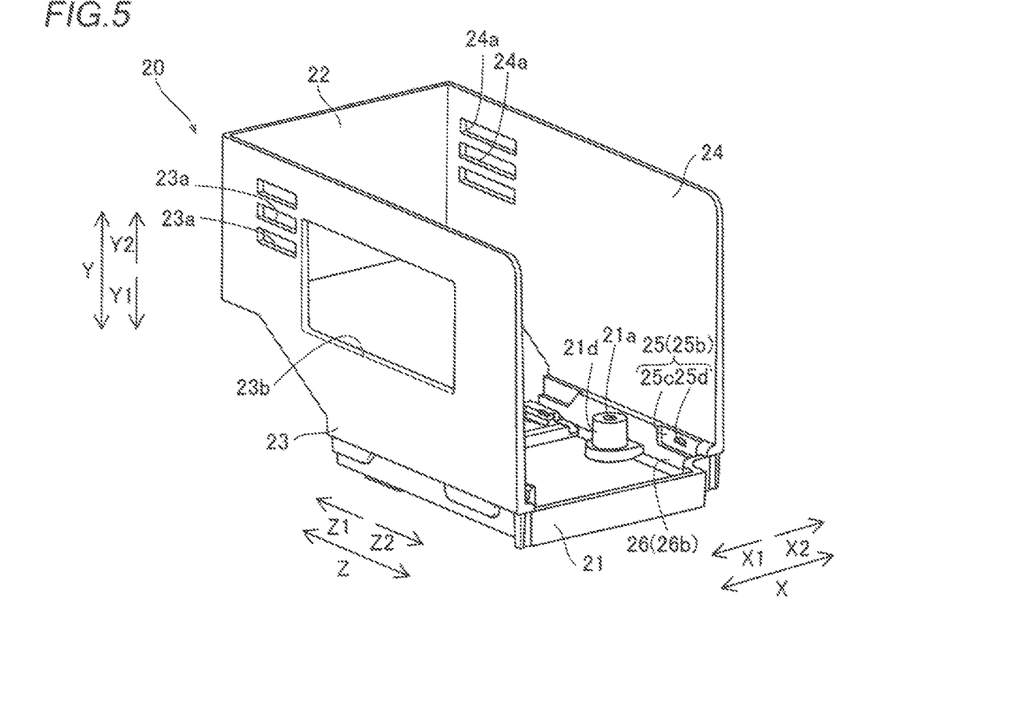
FIG. 5 is another perspective view of the protective cover of the inverter device according to the embodiment of the present invention.

As shown in FIGS. 2, 4, and 5, the front surface portion 21 of the protective cover 20 is configured to cover the control terminal 11d provided on the front surface 11 of the inverter device body portion 10. According to this embodiment, the front surface portion 21 of the protective cover 20 is provided with a hole 21a for fixing the front surface portion 21 to the inverter device body portion 10 by the screw 30. More specifically, the screw 30 is screwed into the screw hole 11e of the inverter device body portion 10 through the hole 21a of the front surface portion 21, whereby the protective cover 20 is fixed to the inverter device body portion 10. As shown in FIG. 5, the hole 21a is provided in a columnar portion 21d protruding toward the inverter device body portion 10.

As shown in FIG. 2, the front surface portion 21 of the protective cover 20 is provided with an opening 21b that exposes the operation portion 11a of the inverter device body portion 10. Specifically, the opening 21b is provided in an upper portion (in the direction Z1) of the front surface portion 21. The opening 21b is provided to straddle the front surface portion 21, the top surface portion 22, the first side surface portion 23, and the second side surface portion 24. More specifically, the opening 21b is formed by partially cutting off the front surface portion 21 along a direction Y and partially cutting off the top surface portion 22 along the direction Z. Furthermore, the opening 21b is formed by partially cutting off the first side surface portion 23 and the second side surface portion 24 in a direction inclined with respect to the direction Z. Thus, in a state where the protective cover 20 is mounted on the inverter device body portion 10 (see FIG. 1), the operation portion 11a of the inverter device body portion 10, a portion of the top surface 12 in the direction Y1, and portions of the first side surface 13 and the second side surface 14 in the direction Y1 (in the direction Z1) are exposed from the opening 21b. The opening 21b is an example of the "opening for an operation portion" in the claims.

As shown in FIG. 2, the front surface portion 21 of the protective cover 20 is provided with a notch 21c communicated with the opening 21b at a position corresponding to the connector connecting portion 11f of the front surface 11 of the inverter device body portion 10. The notch 21c is mounted with a detachable window portion 31 (see FIG. 1) for exposing the connector connecting portion 11f.

According to this embodiment, at least the top surface portion 22 of the top surface portion 22, the first side surface portion 23, and the second side surface portion 24 of the protective cover 20 is configured to cover the slits 12a and the slits 12c both for heat release provided in the top surface 12 of the inverter device body portion 10. Specifically, as shown in FIG. 1, the top surface portion 22 is configured to cover the slits 12a from above (a side in the direction Z1) in a state where the top surface portion 22 is spaced by a distance d1 from the slits 12a (the top surface 12 of the inverter device body portion 10) (or in a state where the top surface portion 22 is in contact with the slits 12a). The top surface portion 22 is also configured to cover the slits 12c from above in a state where the top surface portion 22 is spaced by a distance d2 greater than the distance d1 from the slits 12c. The top surface portion 22 is also configured to cover all the multiple slits 12a and the multiple slits 12c from above. The top surface portion 22 does not cover a portion in the direction Y1 of the top surface 12 of the inverter device body portion 10.

The first side surface portion 23 of the protective cover 20 is provided with multiple slits 23a extending in the direction Z. The slits 23a are provided in a portion corresponding to the slits 13a for heat release provided in a portion in the direction Z1 of the first side surface 13 of the inverter device body portion 10. More specifically, the slits 13a of the inverter device body portion 10 are not covered with the first side surface portion 23 of the protective cover 20. On the other hand, the first side surface portion 23 of the protective cover 20 is configured to cover the slits 13b for heat release provided in a portion in the direction Z2 of the first side surface 13 of the inverter device body portion 10. The slits 23a each have a substantially rectangular shape in a plan view. The length of each of the long sides of the slits 23a and the length of each of the short sides of the slits 23a are substantially equal to the length of each of the long sides of the slits 13a of the first side surface 13 and the length of each of the short sides of the slits 13a of the first side surface 13, respectively.

According to this embodiment, the first side surface portion 23 of the protective cover 20 is provided with an opening 23b. The opening 23b is provided to expose (see FIG. 1) a seal 32 on which the product serial number and ratings of the inverter device 100, for example, are described, applied on the first side surface 13 of the inverter device body portion 10. The opening 23b is provided in the vicinity of a central portion of the first side surface portion 23, and has a substantially rectangular shape. The opening 23b is an example of the "side surface portion opening" in the claims.

As shown in FIGS. 4 and 5, the second side surface portion 24 of the protective cover 20 is provided with slits 24a extending in the direction Z, similarly to the first side surface portion 23. The slits 24a are provided in a portion corresponding to the slits 14a for heat release provided in a portion in the direction Z1 of the second side surface 14 of the inverter device body portion 10. More specifically, the slits 14a of the inverter device body portion 10 are not covered with the second side surface portion 24 of the protective cover 20. On the other hand, the second side surface portion 24 of the protective cover 20 is configured to cover the slits (not shown) for heat release provided in a portion in the direction Z2 of the second side surface 14 of the inverter device body portion 10.

Figure 6:
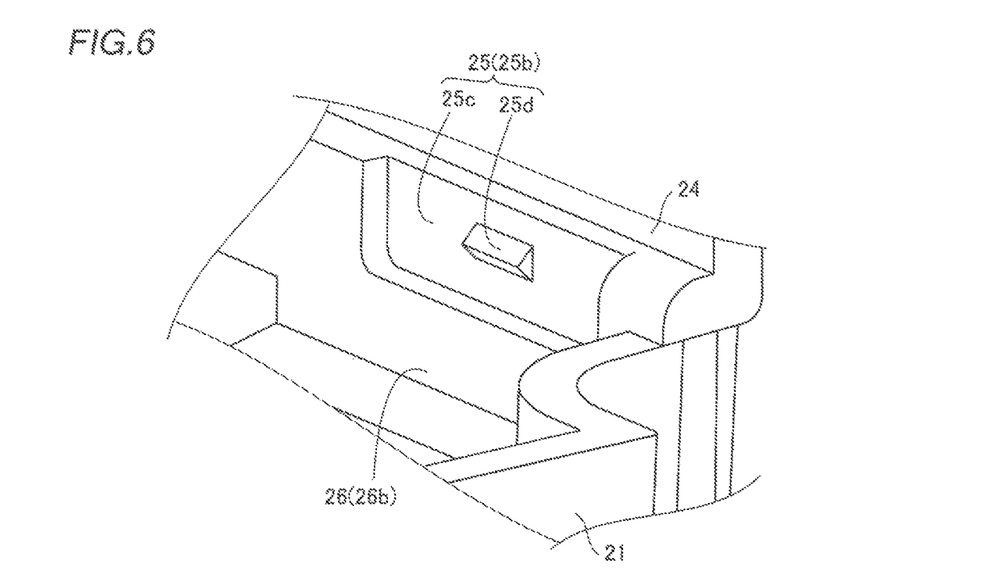
FIG. 6 is a partial enlarged view of FIG. 5.
Figure 7:
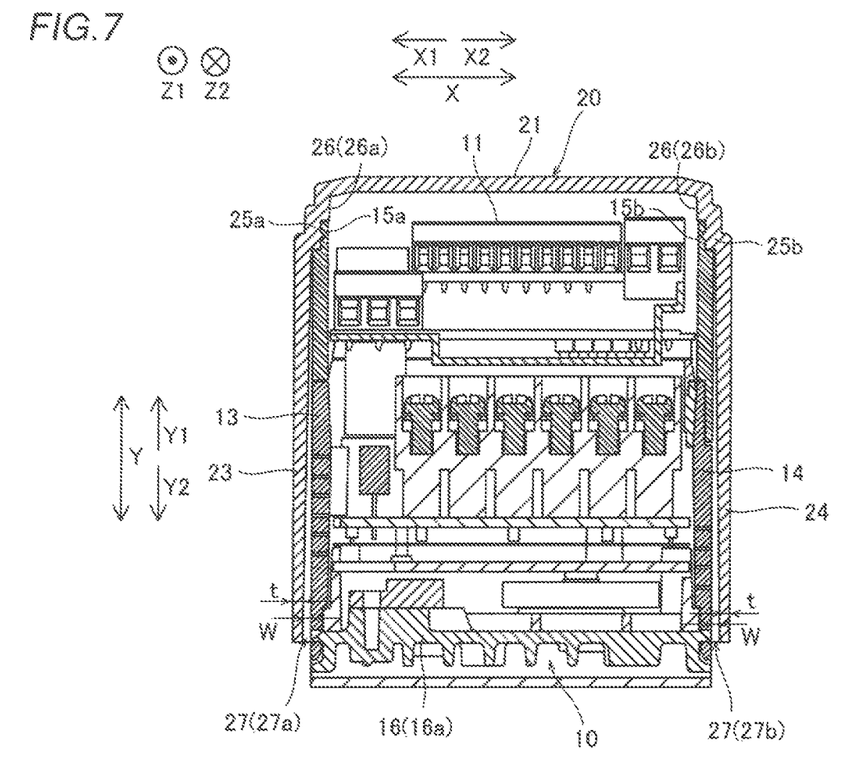
FIG. 7 is a sectional view of the inverter device according to the embodiment of the present invention.
Figure 8:
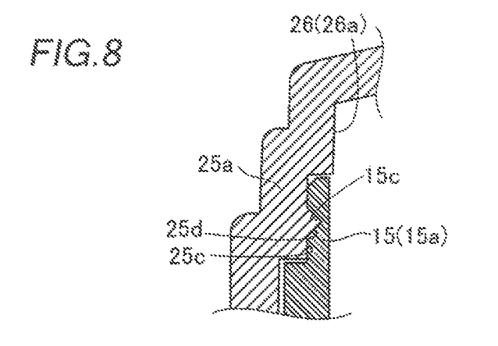
FIG. 8 is a partial enlarged view of FIG. 7.

According to this embodiment, as shown in FIGS. 5 to 7, the protective cover 20 includes the engaging portions 25 that engage with the inverter device body portion 10. As shown in FIG. 7, an engaging portion 25 (engaging portion 25a) is provided in the vicinity of a boundary (in the vicinity of a corner 26a) between the rear surface (inverter device body portion 10) of the front surface portion 21 of the protective cover 20 and the rear surface of the first side surface portion 23. An engaging portion 25 (engaging portion 25b) is provided in the vicinity of a boundary (in the vicinity of a corner 26b) between the rear surface of the front surface portion 21 of the protective cover 20 and the rear surface of the second side surface portion 24.

As shown in FIG. 6, each of the engaging portions 25 includes a substantially rectangular recessed portion 25c provided in the corner 26a (corner 26b) and a substantially triangular protruding portion 25d provided in the vicinity of a central portion of the recessed portion 25c. The engaging portions 25 are provided at positions corresponding to the engaging portions 15 of the inverter device body portion 10. The recessed portions 25c of the engaging portions 25 have shapes (substantially rectangular shapes) corresponding to the engaging portions 15 of the inverter device body portion 10. The protruding portions 25d of these engaging portions 25 and the recessed portions 15c of the engaging portions 15 of the inverter device body portion 10 engage with each other (the protruding portions 25d are fitted into the recessed portions 15c), whereby the protective cover 20 is mounted on the inverter device body portion 10.

According to this embodiment, as shown in FIG. 7, a clearance 27 is provided between the inverter device body portion 10 and at least one of the first side surface portion 23 and the second side surface portion 24 of the protective cover 20. Specifically, clearances 27 (a clearance 27a and a clearance 27b) are provided between the inverter device body portion 10 and both the first side surface portion 23 and the second side surface portion 24 of the protective cover 20. The first side surface portion 23 and the second side surface portion 24 of the protective cover 20 each have a tapered shape in which the thickness t thereof is gradually reduced in the direction Y2. Thus, the widths W of the clearances 27 between the inverter device body portion 10 and both the first side surface portion 23 and the second side surface portion 24 are gradually increased in the direction Y2.

As shown in FIG. 2, a sheet-metal member 40 made of sheet metal and bent in a U-shape is mounted on the lower surface 17 (a surface in the direction Z2) of the inverter device body portion 10. The sheet-metal member 40 is provided with holes 40a. The holes 40a are ones through which wires (not shown) extending from the inverter device body portion 10 pass. Furthermore, a sheet-metal member 41 made of sheet metal and bent in a U-shape is mounted in front (a side in the direction Y1) of the sheet-metal member 40. The sheet-metal member 41 is provided with multiple slits 41a. The sheet-metal member 41 has a function of protecting the wires (not shown) that extend from the inverter device body portion 10. In addition, a sheet-metal member 42 made of sheet metal is mounted on the back surface 16 (the surface in the direction Y2) of the inverter device body portion 10.

(Method for Mounting Protective Cover)

First, the protective cover 20 is relatively moved closer to the inverter device body portion 10. Thus, the protruding portions 25d of the engaging portions 25 of the protective cover 20 and the recessed portions 15c of the engaging portions 15 of the inverter device body portion 10 engage with each other. Then, the screw 30 is screwed into the screw hole 11e of the inverter device body portion 10 through the hole 21a of the front surface portion 21 of the protective cover 20. Thus, the protective cover 20 is fixed to the inverter device body portion 10.

(Effects of This Embodiment)

According to this embodiment, the following effects can be obtained.

According to this embodiment, as hereinabove described, the protective cover 20 integrally includes the front surface portion 21 that covers the front surface 11 of the inverter device body portion 10, the top surface portion 22 that covers the top surface 12 of the inverter device body portion, the first side surface portion 23 that covers the first side surface 13 of the inverter device body portion, and the second side surface portion 24 that covers the second side surface 14 of the inverter device body portion. Thus, the front surface 11, the top surface 12, the first side surface 13, and the second side surface 14 of the inverter device body portion 10 can be covered with the single protective cover 20, and hence an increase in the number of components of the protective cover 20 can be significantly reduced or prevented. Furthermore, the front surface 11, the top surface 12, the first side surface 13, and the second side surface 14 of the inverter device body portion 10 can be covered simply by mounting the single protective cover 20 on the inverter device body portion 10, and hence mounting workability for the protective cover 20 can be improved as compared with the case where protective covers 20 are individually mounted on the front surface 11, the top surface 12, the first side surface 13, and the second side surface 14 of the inverter device body portion 10, respectively.

According to this embodiment, as hereinabove described, the protective cover 20 includes the engaging portions 25 that engage with the inverter device body portion 10, and the inverter device body portion 10 includes the engaging portions 15 that engage with the engaging portions 25. Thus, the protective cover 20 can be easily mounted on the inverter device body portion 10 by engaging the engaging portions 25 of the protective cover 20 with the engaging portions 15 of the inverter device body portion 10.

According to this embodiment, as hereinabove described, the engaging portions 15 of the inverter device body portion 10 protrude forward from the front surface 11 of the inverter device body portion 10. Thus, the protective cover 20 can be mounted on the inverter device body portion 10 by engaging the engaging portions 25 with the engaging portions 15 regardless of the shapes and sizes of the slits, unlike the case where the protective cover 20 is mounted by engaging the engaging portions 25 with the multiple slits (slits 12a, 12c, 13a, 13b, and 14a). More specifically, even when the slits for heat release are optimized (changed in shape) according to the performance of the inverter device body portion 10, the protective cover 20 can be mounted on the inverter device body portion 10 without changing the shape and size of the protective cover 20. Furthermore, the front surface 11, the top surface 12, the first side surface 13, and the second side surface 14 of the inverter device body portion 10 can be covered simply by engaging the engaging portions 15 that protrude forward from the front surface 11 of the inverter device body portion 10 with the engaging portions 25 of the protective cover 20. Consequently, mounting workability for the protective cover 20 can be improved unlike the case where protective covers 20 are individually mounted on the multiple slits.

According to this embodiment, as hereinabove described, the engaging portions 25 are provided on the rear surface of the protective cover 20, and engage with the engaging portions 15 protruding forward from the front surface 11 of the inverter device body portion 10. Thus, the engaging portions 25 and the engaging portions 15 can easily engage with each other simply by mounting the protective cover 20 from the side of the front surface 11 of the inverter device body portion 10.

According to this embodiment, as hereinabove described, the front surface portion 21 of the protective cover 20 covers the control terminal 11d provided on the front surface 11 of the inverter device body portion 10, and at least the top surface portion 22 of the top surface portion 22, the first side surface portion 23, and the second side surface portion 24 of the protective cover 20 covers the slits (the slits 12a and the slits 12c) for heat release provided in the inverter device body portion 10. Thus, entry of extraneous material from above into the inverter device body portion 10 through the slits (the slits 12a and the slits 12c) for heat release can be significantly reduced or prevented by at least the top surface portion 22 while the control terminal 11d can be protected from external impact by the front surface portion 21 of the single protective cover 20.

In addition, the top surface portion 22, the first side surface portion 23, and the second side surface portion 24 are formed to be continuous with the front cover member that covers the front surface 11 (control terminal 11d) of the conventional inverter device body portion 10, whereby the protective cover 20 integrally including the front surface portion 21, the top surface portion 22, the first side surface portion 23, and the second side surface portion 24 according to this embodiment can be easily formed.

According to this embodiment, as hereinabove described, the top surface portion 22 covers the slits 12a (12c) from above in the state where the top surface portion 22 is spaced by the predetermined distance d1 (d2) from the slits 12a (12c). Thus, even when impact is applied from the outside of the top surface portion 22 of the protective cover 20, the impact is partially absorbed by the clearances between the top surface portion 22 and the slits 12a and 12c (inverter device body portion 10), and hence the inverter device body portion 10 can be protected from the external impact.

According to this embodiment, as hereinabove described, the hole 21a for fixing the front surface portion 21 to the inverter device body portion 10 by the screw 30 is provided in the front surface portion 21 of the protective cover 20. Thus, the protective cover 20 integrally includes the front surface portion 21 that covers the front surface 11 of the inverter device body portion 10, the top surface portion 22 that covers the top surface 12 of the inverter device body portion 10, the first side surface portion 23 that covers the first side surface 13 of the inverter device body portion 10, and the second side surface portion 24 that covers the second side surface 14 of the inverter device body portion 10 so that the size (weight) of the protective cover 20 is relatively increased, and hence when engagement of the engaging portions 15 and the engaging portions 25 with each other results in insufficient fixation, the protective cover 20 can be strongly fixed to the inverter device body portion 10 by the screw 30 through the hole 21a. Thus, disengagement of the protective cover 20 having a relatively heavy weight from the inverter device body portion 10 resulting from vibration or the like can be effectively and significantly reduced or prevented.

According to this embodiment, as hereinabove described, the opening 23b is provided in at least one of the first side surface portion 23 and the second side surface portion 24 of the protective cover 20. Thus, the seal 32 on which the product serial number and ratings, for example, are described, applied on at least one of the first side surface 13 and the second side surface 14 of the inverter device body portion 10 can be easily checked through the opening 23b in the state where the protective cover 20 is mounted on the inverter device body portion 10.

According to this embodiment, as hereinabove described, the opening 21b that exposes the operation portion 11a of the inverter device body portion 10 is provided in the front surface portion 21 of the protective cover 20. Thus, the operation portion 11a can be operated in the state where the protective cover 20 is mounted on the inverter device body portion 10.

According to this embodiment, as hereinabove described, the opening 21b is provided to straddle the front surface portion 21, the top surface portion 22, the first side surface portion 23, and the second side surface portion 24. Thus, each of the front surface 11, the top surface 12, the first side surface 13, and the second side surface 14 of the inverter device body portion 10 is at least partially exposed from the opening 21b, and hence heat can be effectively released from the opening 21b.

According to this embodiment, as hereinabove described, the clearance 27 is provided between the inverter device body portion 10 and at least one of the first side surface portion 23 and the second side surface portion 24 of the protective cover 20. Thus, even when impact is applied from the outside of at least one of the first side surface portion 23 and the second side surface portion 24 of the protective cover 20, the impact is partially absorbed by the clearance 27 (more specifically, the clearance 27 allows the protective cover 20 to warp so that the impact is partially absorbed), and hence the inverter device body portion 10 can be more effectively protected from the external impact as compared with the case where there is no clearance 27.

According to this embodiment, as hereinabove described, at least one of the first side surface portion 23 and the second side surface portion 24 of the protective cover 20 has the tapered shape in which the thickness t thereof is gradually reduced so that the clearance 27 is provided between the inverter device body portion 10 and at least one of the first side surface portion 23 and the second side surface portion 24 of the protective cover 20. Thus, the clearance 27 can be easily formed between the inverter device body portion 10 and at least one of the first side surface portion 23 and the second side surface portion 24 of the protective cover 20.

[Modification]

The embodiment disclosed this time must be considered as illustrative in all points and not restrictive. The range of the present invention is shown not by the above description of the embodiment but by the scope of claims for patent, and all modifications within the meaning and range equivalent to the scope of claims for patent are further included.

For example, while the protruding portions 25d are provided in the protective cover 20, and the recessed portions 15c are provided in the inverter device body portion 10 in the aforementioned embodiment, the present invention is not restricted to this. For example, recessed portions may alternatively be provided in the protective cover 20, and protruding portions may alternatively be provided in the inverter device body portion 10.

While the first side surface portion 23 (second side surface portion 24) of the protective cover 20 does not cover the slits 13a (slits 14a) provided in the portion in the direction Z1 of the first side surface 13 (second side surface 14) of the inverter device body portion 10, but covers the slits 13b (unshown slits) provided in the portion in the direction Z2 of the first side surface 13 (second side surface 14) of the inverter device body portion 10 in the aforementioned embodiment, the present invention is not restricted to this. For example, the first side surface portion 23 and the second side surface portion 24 of the protective cover 20 may alternatively cover all the slits provided in the first side surface 13 (second side surface 14) of the inverter device body portion 10, or may not cover all the slits.

While the front surface portion 21 of the protective cover 20 is fixed to the inverter device body portion 10 by the screw 30 in the aforementioned embodiment, the present invention is not restricted to this. For example, the front surface portion 21 of the protective cover 20 may alternatively be fixed to the inverter device body portion 10 by a member other than the screw 30.

While the opening 23b that exposes the seal 32 on which the product serial number and ratings, for example, are described is provided in the first side surface portion 23 of the protective cover 20 in the aforementioned embodiment, the present invention is not restricted to this. For example, the opening that exposes the seal 32 on which the product serial number and ratings, for example, are described may alternatively be provided in the second side surface portion 24 of the protective cover 20.

While the opening 21b that exposes the operation portion 11a is provided to straddle the front surface portion 21, the top surface portion 22, the first side surface portion 23, and the second side surface portion 24 in the aforementioned embodiment, the present invention is not restricted to this. For example, the opening 21b that exposes the operation portion 11a may alternatively be provided in only the front surface portion 21.

While the opening 21b that exposes the operation portion 11a is provided in the upper portion (in the direction Z1) of the front surface portion 21 in the aforementioned embodiment, the present invention is not restricted to this. When the operation portion 11a is provided in a central portion or a lower portion of the front surface 11 of the inverter device body portion 10, for example, the opening 21b that exposes the operation portion 11a is provided at a position (a central portion or a lower portion) corresponding to the position of the operation portion 11a.

While the clearances 27 are provided between the inverter device body portion 10 and both the first side surface portion 23 and the second side surface portion 24 of the protective cover 20 in the aforementioned embodiment, the present invention is not restricted to this. For example, the clearance 27 may alternatively be provided only between the inverter device body portion 10 and one of the first side surface portion 23 and the second side surface portion 24 of the protective cover 20.

What is claimed is:

1. An inverter device comprising:
    an inverter device body portion; and
    a protective cover that covers the inverter device body portion, and integrally includes a front surface portion that covers a front surface of the inverter device body portion from a front of the inverter device body portion, a top surface portion that covers a top surface of the inverter device body portion from above the inverter device body portion, a first side surface portion that covers a first side surface of the inverter device body portion from a first side of the inverter device body portion, and a second side surface portion that covers a second side surface of the inverter device body portion from a second side of the inverter device body portion, wherein
    the protective cover is mounted over the inverter device body portion to surround the inverter device body portion so that the inverter device body is disposed on an inner side of the protective cover.

2. The inverter device according to claim 1, wherein
    the protective cover includes a first engaging portion that engages with the inverter device body portion, and the inverter device body portion includes a second engaging portion that engages with the first engaging portion.

3. The inverter device according to claim 2, wherein
    the second engaging portion of the inverter device body portion protrudes forward from the front surface of the inverter device body portion.

4. The inverter device according to claim 3, wherein
    the first engaging portion is provided on a rear surface of the protective cover, and engages with the second engaging portion protruding forward from the front surface of the inverter device body portion.

5. The inverter device according to claim 1, wherein
    the front surface portion of the protective cover is provided with a fastening hole for fixing the front surface portion to the inverter device body portion by a fastening member.

6. The inverter device according to claim 1, wherein
    at least one of the first side surface portion and the second side surface portion of the protective cover is provided with a side surface portion opening.

7. The inverter device according to claim 1, wherein
    the front surface portion of the protective cover is provided with an opening for an operation portion that exposes the operation portion of the inverter device body portion.

8. The inverter device according to claim 1, wherein
    a clearance is provided between the inverter device body portion and at least one of the first side surface portion and the second side surface portion of the protective cover.

9. The inverter device according to claim 8, wherein
    at least one of the first side surface portion and the second side surface portion of the protective cover has a tapered shape in which a thickness thereof is gradually reduced such that the clearance is provided between the inverter device body portion and at least one of the first side surface portion and the second side surface portion of the protective cover.

10. The inverter device according to claim 1, wherein the inverter device body portion includes a switching element, and is arranged such that the front surface, the top surface, and the first and second side surfaces surround the switching element as walls for forming the inverter device body portion.

11. The inverter device according to claim 10, wherein the inverter device body portion further includes a heat radiation member for radiating heat from the switching element, provided at a back surface of the inverter device body portion, the protective cover being mounted over the inverter device body portion to cover the front surface, the top surface, the first and second side surfaces, and the heat radiation member.

12. An inverter device comprising:
    an inverter device body portion; and
    a protective cover that covers the inverter device body portion, wherein
    the protective cover integrally includes a front surface portion that covers a front surface of the inverter device body portion, a top surface portion that covers a top surface of the inverter device body portion, a first side surface portion that covers a first side surface of the inverter device body portion, and a second side surface portion that covers a second side surface of the inverter device body portion, and
    the front surface portion of the protective cover covers a control terminal provided on the front surface of the inverter device body portion, and at least the top surface portion among the top surface portion, the first side surface portion, and the second side surface portion of the protective cover covers a slit for heat release provided in the inverter device body portion.

13. The inverter device according to claim 12, wherein
    the top surface portion covers the slit from above in a state where the top surface portion is spaced by a predetermined distance from the slit.

14. An inverter device comprising:
    an inverter device body portion; and
    a protective cover that covers the inverter device body portion, wherein
    the protective cover integrally includes a front surface portion that covers a front surface of the inverter device body portion, a top surface portion that covers a top surface of the inverter device body portion, a first side surface portion that covers a first side surface of the inverter device body portion, and a second side surface portion that covers a second side surface of the inverter device body portion,
    the front surface portion of the protective cover is provided with an opening for an operation portion that exposes the operation portion of the inverter device body portion, and
    the opening for the operation portion is provided to straddle the front surface portion, the top surface portion, the first side surface portion, and the second side surface portion.

* * * * *